United States Patent
Yu et al.

(10) Patent No.: US 6,767,407 B2
(45) Date of Patent: Jul. 27, 2004

(54) AUTO-CENTERING DEVICE FOR MECHANICAL CLAMP

(75) Inventors: Chi-Fu Yu, Taipei (TW); Song-Yueha Lin, Yung-Count (TW); Hom-Chung Lin, Taichung (TW); Zuo-Chang Yen, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 119 days.

(21) Appl. No.: 10/140,733

(22) Filed: May 7, 2002

(65) Prior Publication Data

US 2003/0209325 A1 Nov. 13, 2003

(51) Int. Cl.[7] ........................... H01L 21/00; C23C 16/00
(52) U.S. Cl. .................. 118/728; 118/715; 156/345.51
(58) Field of Search ........................ 118/728, 715–730; 156/345.51, 345.2

(56) References Cited

U.S. PATENT DOCUMENTS 5,796,066 A * 8/1998 Guyot ................... 219/121.48
6,146,463 A * 11/2000 Yudovsky et al. .......... 118/729

* cited by examiner

Primary Examiner—P. Hassanzadeh
Assistant Examiner—Ram N Kackar
(74) Attorney, Agent, or Firm—Tung & Associates

(57) ABSTRACT

A substrate holding mechanism which is particularly adaptable to automatically centering a semiconductor wafer on a platen spider as the wafer is lowered from a wafer loading and unloading position to a wafer processing position in a medium current implanter such as a Varian EHP500. Upon subsequent placement of a mechanical clamp on the wafer to hold the wafer on the platen, the clamp fingers of the clamp engage the edge of the wafer with substantially uniform pressure to prevent micro-cracking or fracturing of the wafer.

10 Claims, 2 Drawing Sheets

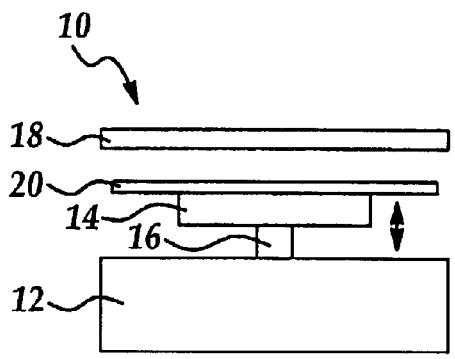
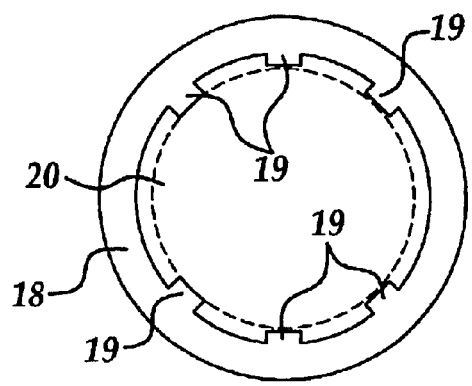
Figure 1
*Prior Art*
Figure 2
*Prior Art*
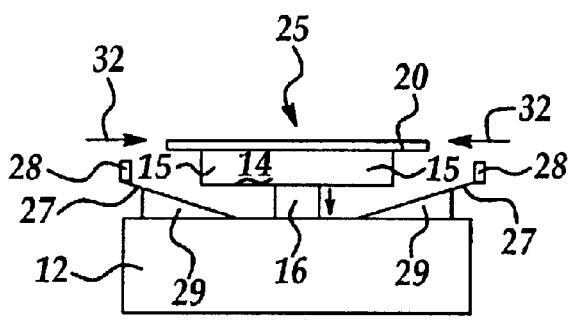
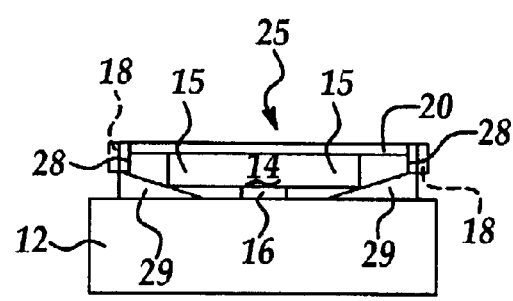
Figure 3
Figure 4
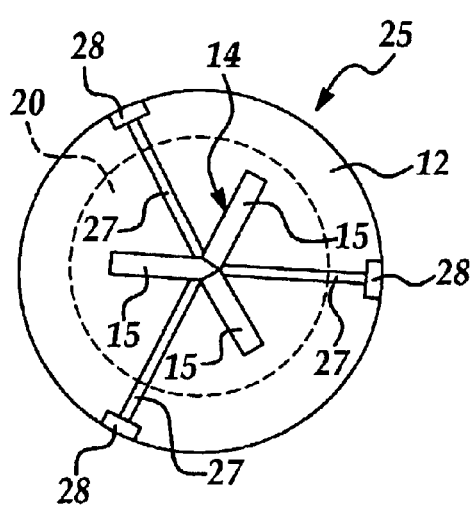
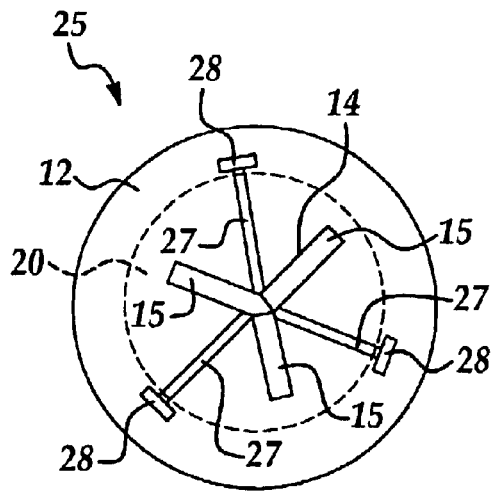
Figure 5
Figure 6

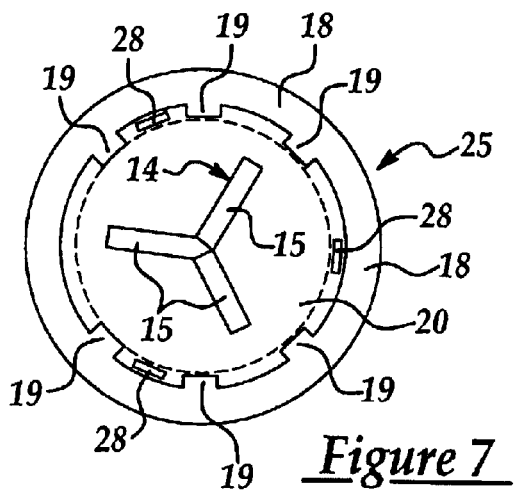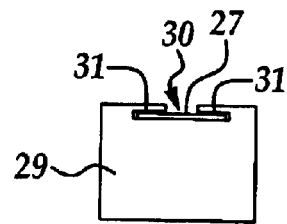
*Figure 7*
*Figure 9*
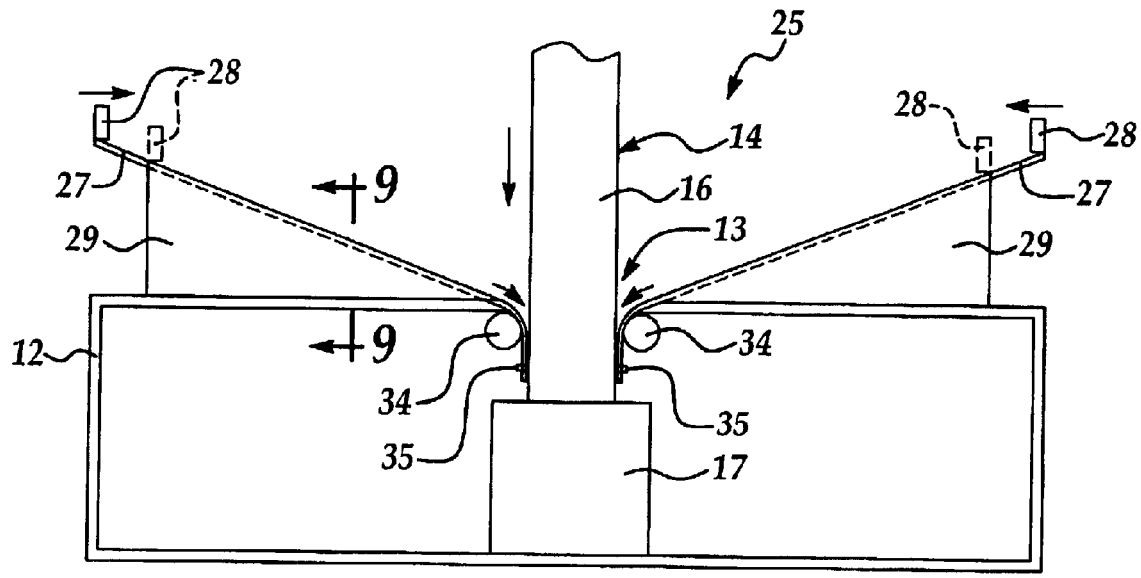
*Figure 8*
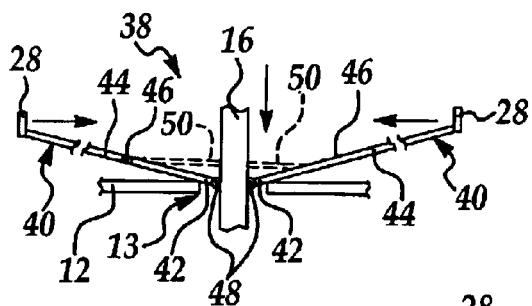
*Figure 10*
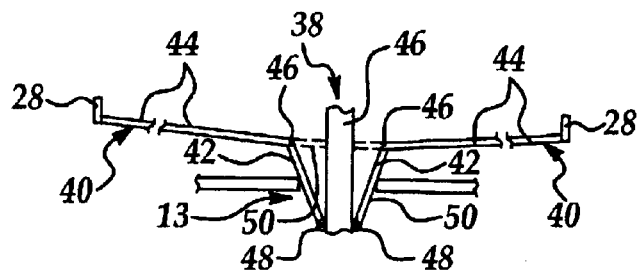
*Figure 11*

AUTO-CENTERING DEVICE FOR MECHANICAL CLAMP

FIELD OF THE INVENTION

The present invention relates to mechanical clamps for clamping a semiconductor wafer on a platen for processing of the semiconductor wafer. More particularly, the invention relates to a device for automatically centering a wafer on a platen spider before clamping the wafer on a platen in a medium current implanter for processing the wafer.

BACKGROUND OF THE INVENTION

As semiconductor wafers processed in the semiconductor production industry progressively become larger in diameter, batch-processing ion implanters for processing multiple semiconductor wafers at one time are being replaced by ion implanters which process one semiconductor wafer at a time. Such single-substrate-processing ion implanters have two multi-articulated robot arm assemblies (substrate holding robots or substrate holding devices) with respect to one ion beam. These articulated robot arm assemblies allow the ion implanters to operate efficiently. The articulated robot arm assembly moves the semiconductor wafer in a direction perpendicular to the ion beam to allow the ion beam to be applied to the substrate. The robot arm assembly also replaces the semiconductor wafer with a new wafer.

The single-substrate processing ion implanter typically further includes two load-lock chambers into which are placed cassettes storing multiple semiconductor wafers. Feed robots for transferring the wafers are positioned between the load-lock chambers and the articulated robot arm assemblies, thus defining two parallel feed lines. Wafers are reciprocally transferred by the feed robots along the feed lines between the cassettes and the articulated robot assemblies.

Because the substrate holding devices and the cassettes are provided exclusively for respective groups of wafers, movement of the wafers is limited and cannot be flexibly adapted to various operating conditions. For example, if two successive substrates are made defective by an ion implantation failure due to a malfunction of an ion source or the like, then the subsequent processing is adversely affected because the defective substrates must be returned to the respective cassettes.

It is advantageous that each of the feed robots disposed between the load-lock chambers and the articulated robot arm assemblies has a clamp machanism for reliably and quickly feeding a wafer. One type of clamp mechanism utilizes a vacuum force, which cannot be used in a vacuum atmosphere or ambient and tends to apply a large quantity of particles to a wafer as it contacts a wide area of the wafer. Another clamp mechanism has an actuator for opening and closing clamp fingers.

Each of the articulated robot arm assemblies includes a substrate holding mechanism which includes a wafer holder or platen for holding the wafer, a clamp mechanism for mechanically securing the substrate on the platen, a substrate attracting mechanism such as an electrostatic chuck for attracting the substrate under electrostatic forces, a substrate cooling mechanism for cooling the substrate, and a substrate attaching and removing mechanism including a clamp operating mechanism for operating the clamp mechanism. These elements are provided on the end of the assembly.

Referring to FIGS. 1 and 2 of the drawings, a typical conventional substrate holding mechanism, such as that used in a Varian EHP500 medium current implanter, is generally indicated by reference numeral 10 and includes a platen 12 fitted with a mechanically-actuated platen spider 14 having an extendible spider pillar 16. The spider pillar 16 extends through a central platen opening (not illustrated) and is engaged by a spider actuation mechanism (not illustrated) for selectively raising and lowering the spider pillar 16. Accordingly, the platen spider 14 is operable between an upwardly-extended position, illustrated in FIG. 1, for receiving a semiconductor wafer 20 from or transferring the wafer 20 to a robot wafer handler (not illustrated), and a lower position (not illustrated) for clamping of the wafer 20 to the platen 12 and processing of the wafer 20. When the platen spider 14 is in the lower position on the platen 12, a robotic arm (not illustrated) inserts a mechanical clamp 18 around the wafer 20 to secure the wafer 20 to the platen 12 for implanting of ions into the wafer 20. Accordingly, as illustrated in FIG. 2, the mechanical clamp 18 includes multiple, inwardly-extending clamp fingers 19 which contact the peripheral edge of the wafer 20.

One of the problems frequently encountered in the conventional substrate holding mechanism 10 is that the wafer 20 is not accurately centered on the platen spider 14 when the mechanical clamp 18 is fitted thereon. Consequently, as illustrated in FIG. 2, some of the clamp fingers 19 tend to engage one edge of the wafer 20 more tightly than the other clamp fingers 19 engage the opposite edge of the wafer 20. This can cause micro-fractures to form in the wafer 20 where the clamp fingers 19 more tightly engage the wafer 20, thus resulting in significant wafer scrapping as well as machine down time due to the damage to the wafers 20.

Accordingly, a device is needed for automatically centering the wafer 20 on the spider 14 prior to inserting the mechanical clamp 18 on the wafer 20, to facilitate equal pressure distribution of the clamp fingers 19 against the edge of the wafer 20 and thus, prevent excessive pressure of any of the clamp fingers 19 against the wafer 20 and micro-cracking or fracturing of the wafer 20.

SUMMARY OF THE INVENTION

An object of the present invention is to provide a device for automatically centering a semiconductor wafer on a platen for processing of the wafer.

Another object of the present invention is to provide a device for preventing micro-cracking or fracturing of a semiconductor wafer in an ion implanter upon clamping of the wafer to a platen.

Still another object of the present invention is to provide a device for centering a semiconductor wafer on a platen spider to facilitate substantially uniform contact of a mechanical clamp with the edges of the wafer upon fitting the clamp on the wafer and securing the wafer to the platen.

Yet another object of the present invention is to provide an auto-centering device which is adaptable to the Varian EHP500 medium current implanter for automatically centering a semiconductor wafer on a platen spider as the wafer is lowered on the platen spider from a wafer loading and unloading position to a wafer processing position.

In accordance with these and other objects and advantages, the present invention comprises a substrate holding mechanism which is particularly adaptable to automatically centering a semiconductor wafer on a platen spider as the wafer is lowered from a wafer loading and unloading position to a wafer processing position in a medium current implanter such as a Varian EHP500. Upon subsequent placement of a mechanical clamp on the wafer to hold the wafer on the platen, the clamp fingers of the clamp engage the edge of the wafer with substantially uniform pressure to prevent micro-cracking or fracturing of the wafer.

BRIEF DESCRIPTION OF THE DRAWINGS

The invention will now be described, by way of example, with reference to the accompanying drawings, wherein:

FIG. 1 is a side view of a typical conventional substrate holding mechanism used in a medium current implanter such as a Varian EHP500 implanter;

FIG. 2 is a top view of a typical conventional mechanical clamp, engaging a semiconductor wafer for securing the wafer to the platen of the implanter in conventional fashion, more particularly illustrating typical non-uniform engagement of the clamp fingers with the wafer;

FIG. 3 is a side view of an illustrative embodiment of the substrate holding mechanism of the present invention, with the platen, platen spider and wafer shown in the upper, wafer loading and unloading position;

FIG. 4 is a side view of the substrate holding mechanism illustrated in FIG. 3, with the platen, platen spider and wafer shown in the lower, wafer-clamping and processing position;

FIG. 5 is a top view of the substrate holding mechanism, with the wafer (in phantom) supported on the platen spider prior to lowering the platen spider and wafer to the lower, wafer-processing position;

FIG. 6 is a top view of the substrate holding mechanism, with the platen spider and wafer in the lower, wafer-processing position and the auto-centering device of the mechanism engaging and centering the wafer on the platen spider;

FIG. 7 is a top view of the substrate holding mechanism, with the platen spider and wafer in the lower, wafer-processing position and the clamp fingers of the mechanical clamp uniformly engaging the wafer due to auto-centering of the wafer on the platen spider;

FIG. 8 is a sectional view of an illustrative embodiment of the substrate holding mechanism of the present invention, more particularly illustrating an illustrative mechanism for auto-centering a wafer on the platen spider;

FIG. 9 is a cross-sectional view, taken along section lines 9—9 in FIG. 8;

FIG. 10 is a sectional view of another illustrative embodiment of the substrate holding mechanism of the present invention, illustrating an alternative mechanism for attaching auto-centering arms to the platen spider, with the platen spider in the upper, wafer loading and unloading position; and FIG. 11 illustrates the platen spider of the mechanism of FIG. 10 in the lower, wafer-processing position.

DESCRIPTION OF THE PREFERRED EMBODIMENTS

The present invention has particularly beneficial utility in the automatic centering of a semiconductor wafer on a platen spider before fitting a mechanical clamp on the wafer in a Varian EHP500 medium current implanter. However, the invention is not so limited in application, and while references may be made to such medium current implanter, the invention may be applicable to centering semiconductor wafers or other substrates on a support or surface in a variety of industrial and mechanical applications.

Referring to FIGS. 3–9, an illustrative embodiment of the substrate holding mechanism of the present invention is generally indicated by reference numeral 25 and includes at least three auto-centering arms 27 which are fitted on the platen 12 to facilitate automatically centering a wafer 20 on the platen spider 14 as the wafer 20 is lowered from an upper, wafer loading and unloading position as illustrated in FIG. 3 to a lower, wafer processing position as illustrated in FIG. 4 and hereinafter further described. The auto-centering arms 27 are typically equally-spaced from each other around the circumference of the platen 12. As illustrated in FIG. 8, an upward-standing, triangular arm support 29 may be provided on the upper surface of the platen 12 for supporting each auto-centering arm 27. The platen 12 includes a central platen opening 13 provided in the upper surface thereof, through which platen opening 13 the spider pillar 16 extends and engages a spider actuation mechanism 17 inside the platen 12. Each of the auto-centering arms 27 may be constructed of an elongated segment of bendable, resilient or flexible metal or plastic, and the distal end of each auto-centering arm 27 terminates in a centering finger 28. As illustrated in FIG. 9, the auto-centering arm 27 may be slidably disposed in an arm groove 30 of the arm support 29 and retained therein by operation of a pair of inwardly-extending arm retainers 31. Each auto-centering arm 27 extends through the platen opening 13, over a corresponding roller 34 mounted inside the platen 12 beneath the upper surface thereof, as illustrated in FIG. 8, and the proximal end of each auto-centering arm 27 is attached to the spider pillar 16 by means of an arm attachment pin 35 or other suitable fastener. Accordingly, the centering fingers 28 on the respective auto-centering arms 27 are capable of movement between the outward position indicated by the solid lines in FIG. 8, wherein the spider pillar 16 is located in the upper, wafer loading and unloading position, and the inward position indicated by the phantom lines, wherein the spider pillar 16 is located in the lower, wafer-processing position. The location between the centering finger 28 and the arm attachment pin 35 on each auto-centering arm 27 is the same, such that the centering fingers 28 remain equidistant from the spider pillar 16 throughout the entire range of movement. The spider pillar 16 is typically selectively raised and lowered through the platen opening 13 by operation of the conventional spider actuation mechanism 17 inside the platen 12.

Typical operation of the substrate holding mechanism 25 of the present invention is illustrated in FIGS. 3–8, wherein the platen spider 14 is initially disposed in the upper, wafer loading and unloading position of FIG. 3. A robotic arm (not illustrated) of a wafer handler initially places a semiconductor wafer 20 on the multiple spider arms 15 of the platen spider 14. Due to inaccuracies in the wafer placement or loading operation by the wafer handler, the wafer 20 is typically off-center on the platen spider 14. Next, the spider actuation mechanism 17 (FIG. 8) is operated to draw the spider pillar 16 into the platen 12 through the platen opening 13 thereof. This action causes the descending spider pillar 16 to pull the proximal ends of the auto-centering arms 27 downwardly at the respective arm attachment pins 35, such that the distal ends of the auto-centering arms 27, and thus, the respective centering fingers 28, are drawn inwardly in concert with each other, toward the spider pillar 16 as each auto-centering arm 27 slides through the arm groove 30 (FIG. 9) of the corresponding arm support 29. When the pillar spider 14 and wafer 20 reach the lower, wafer-processing position 20 illustrated in FIG. 4, as throughout the entire range of movement of the spider pillar 16 the centering fingers 28 are located equidistant from the spider pillar 16, and thus, the center of the wafer 20. Accordingly, in the event that the wafer 20 is off-center on the spider arms 15, at least one of the centering fingers 28 engages and pushes the wafer 20 on the spider arms 15 until the wafer 20 is centered thereon and all of the centering fingers 20 engage the wafer 20 with equal pressure. Next, a robotic arm (not illustrated) in the conventional ion implanter or other processing tool (not illustrated) positions the mechanical clamp 12 on the wafer 20 for attachment of the wafer 20 to the platen 12 in conventional fashion. Because the wafer 20 is centered on the spider fingers 15, the clamp fingers 19 of the mechanical clamp 18 engage the edge of the wafer 20 with substantially equal pressure, as illustrated in FIG. 7, and this prevents micro-cracking or fracturing of the wafer 20 due to excessive pressure of one or more of the clamp fingers 19 against the wafer 20 which would otherwise result if the mechanical clamp 18 were fitted on the off-center wafer 20.

After the wafer 20 is processed inside the ion implanter or other processing tool (not illustrated) on the platen 12, in conventional fashion, a robotic arm (not illustrated) removes the mechanical clamp 18 from the wafer 20; the spider pillar 16 is raised from the wafer-processing position (FIG. 4) to the wafer-loading and unloading position (FIG. 3) by operation of the spider actuation mechanism 17, whereupon the auto-centering arms 27 are pushed upwardly at the respective arm attachment pins 35 to slide the auto-centering arm 27 in concert through the arm grooves 30 of the respective arm supports 29 to return the centering fingers 28 to the outward position illustrated in FIGS. 3 and 5 and in solid lines in FIG. 8; and the robotic arm (not illustrated) of the wafer handler removes the wafer 20 from the spider arms 15 for further processing of the wafer 20 at another location.

Referring next to FIGS. 10 and 11 of the drawings, another embodiment of the substrate holding mechanism of the present invention is generally indicated by reference numeral 38, and each auto-centering arm 40 thereof includes a proximal arm segment 42 which is pivotally attached to the spider pillar 16 at an arm hinge 48. The extending end of the proximal arm segment 42 is pivotally attached to a distal arm segment 44 at a pivot 46, and the extending end of the distal arm segment 44 is fitted with an upward-standing centering finger 28. When the spider pillar 16 is located in the upper, wafer loading and unloading position, as illustrated in FIG. 10, each arm hinge 48 is located in or immediately above the platen opening 13 of the platen 12, with the proximal arm segment 42 resting on the edge of the platen opening 13. Upon lowering of the spider pillar 16 to the wafer-processing position of FIG. 11, the descending spider pillar 16 pushes the proximal arm segments 42 of the respective auto-centering arms 40 through the platen opening 13, whereupon the proximal arm segments 42 are drawn in concert toward the spider pillar 16 by the edge of the platen opening 13 as the proximal arm segments 42 pivot at the respective arm hinges 48. Simultaneously, the proximal arm segments 42 pivot on the distal arm segments 44 at the respective pivots 46, and draw the distal arm segments 44 inwardly such that the centering fingers 28 are drawn inwardly and horizontally in concert toward the spider pillar 16. Accordingly, the centering fingers 28 remain equidistant from the spider pillar 16 throughout the entire range of movement thereof, and operate to center the wafer 20 on the spider arms 15 as the wafer 20 and platen spider 14 are lowered to the wafer-processing position of FIG. 11. A spring 50 may be interposed between the spider pillar 16 and the proximal arm segment 42 of each auto-centering arm 40 to return each auto-centering arm 40 to the straightened position and thus, each centering finger 28 to the outward position of FIG. 10.

While the preferred embodiments of the invention have been described above, it will be recognized and understood that various modifications can be made in the invention and the appended claims are intended to cover all such modifications which may fall within the spirit and scope of the invention.

What is claimed is:

1. A substrate holding mechanism having an auto-centering device for centering a substrate, said substrate holding mechanism comprising:
   a platen;
   a platen spider selectively extendible from said platen and selectively positional between an upper position and a lower position;
   at least three auto-centering arms engaging said platen spider, said at least three auto-centering arms having substantially equal lengths;
   wherein said at least three auto-centering arms are disposed in an outwardly-extending configuration when said platen spider is disposed in said upper position and move in concert with each other to an inwardly-extended configuration when said platen spider moves to said lower position;
   a centering finger carried by each of said at least three auto-centering arms for engaging the substrate when said platen spider is in said lower position;
   wherein each of said at least three auto-centering arms is a flexible, resilient material and further comprising at least three arm supports provided on said platen for supporting said at least three auto-centering arms, respectively; and
   at least three arm rollers provided in said platen and wherein said at least three auto-centering arms slidably engages said at least three arm rollers, respectively.

2. The substrate holding mechanism of claim 1 wherein said platen spider comprises at least three spider arms.

3. The substrate holding mechanism of claim 1 wherein said platen spider comprises at least three spider arms.

4. The substrate holding mechanism of claim 1 comprising an arm groove provided in each of said at least three arm supports, and wherein said each of said at least three auto-centering arms is slidably mounted in said arm groove.

5. The substrate holding mechanism of claim 1 wherein said platen spider comprises at least three spider arms.

6. The substrate holding mechanism of claim 1 further comprising an arm hinge provided on said platen spider and wherein each of said at least three auto-centering arms comprises a proximal arm segment pivotally attached to said platen spider at said arm hinge and a distal arm segment pivotally attached to said proxmial arm segment, and wherein said centering finger is carried by said distal arm segment.

7. The substrate holding mechanism of claim 6 wherein said platen spider comprises at least three spider arms.

8. The substrate holding mechanism of claim 1 wherein said platen spider comprises at least three spider arms.

9. The substrate holding mechanism of claim 1 comprising an arm groove provided in each of said at least three arm supports, and wherein said each of said at least three auto-centering arms is slidably mounted in said arm groove.

10. The substrate holding mechanism of claim 9 wherein said platen spider comprises at least three spider arms.

* * * * *